United States Patent
Lea et al.

(10) Patent No.: US 10,120,740 B2
(45) Date of Patent: Nov. 6, 2018

(54) APPARATUS AND METHODS FOR DEBUGGING ON A MEMORY DEVICE

(71) Applicant: Micron Technology, Inc., Boise, ID (US)

(72) Inventors: Perry V. Lea, Eagle, ID (US); Shawn Rosti, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 15/077,318

(22) Filed: Mar. 22, 2016

(65) Prior Publication Data

US 2017/0277581 A1    Sep. 28, 2017

(51) Int. Cl.
G06F 11/00     (2006.01)
G06F 11/07     (2006.01)
G06F 11/36     (2006.01)

(52) U.S. Cl.
CPC .......... *G06F 11/073* (2013.01); *G06F 11/079* (2013.01); *G06F 11/0778* (2013.01); *G06F 11/364* (2013.01)

(58) Field of Classification Search
CPC .... G06F 11/073; G06F 11/079; G06F 11/364; G06F 3/0619; G06F 3/0665; G06F 3/0689; G11C 29/026; G11C 29/14; G11C 29/44
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Joshua P Lottich
(74) *Attorney, Agent, or Firm* — Brooks, Cameron & Huebsch, PLLC

(57) ABSTRACT

The present disclosure includes apparatus and methods for debugging on a memory device. An example apparatus comprises a memory device having an array of memory cells and sensing circuitry coupled to the array. The sensing circuitry includes a sense amplifier and a compute component configured to perform logical operations on the memory device. A controller is coupled to the array and sensing circuitry and configured to cause the memory device to store debugging code in the array of memory cells and execute instructions to perform logical operations using the sensing circuitry. The controller is further configured to receive an indication in the executing instructions to halt a logical operation, and to execute the debugging code on the memory device.

34 Claims, 9 Drawing Sheets

(56) References Cited

U.S. PATENT DOCUMENTS

| | | | |
|---|---|---|---|
| 4,977,542 | A | 12/1990 | Matsuda et al. |
| 5,023,838 | A | 6/1991 | Herbert |
| 5,034,636 | A | 7/1991 | Reis et al. |
| 5,201,039 | A | 4/1993 | Sakamura |
| 5,210,850 | A | 5/1993 | Kelly et al. |
| 5,253,308 | A | 10/1993 | Johnson |
| 5,276,643 | A | 1/1994 | Hoffmann et al. |
| 5,325,519 | A | 6/1994 | Long et al. |
| 5,357,628 | A * | 10/1994 | Yuen .................. G06F 11/3648 714/34 |
| 5,367,488 | A | 11/1994 | An |
| 5,379,257 | A | 1/1995 | Matsumura et al. |
| 5,386,379 | A | 1/1995 | Ali-Yahia et al. |
| 5,398,213 | A | 3/1995 | Yeon et al. |
| 5,440,482 | A | 8/1995 | Davis |
| 5,446,690 | A | 8/1995 | Tanaka et al. |
| 5,473,576 | A | 12/1995 | Matsui |
| 5,481,500 | A | 1/1996 | Reohr et al. |
| 5,485,373 | A | 1/1996 | Davis et al. |
| 5,506,811 | A | 4/1996 | McLaury |
| 5,615,404 | A | 3/1997 | Knoll et al. |
| 5,638,128 | A | 6/1997 | Hoogenboom |
| 5,638,317 | A | 6/1997 | Tran |
| 5,654,936 | A | 8/1997 | Cho |
| 5,678,021 | A | 10/1997 | Pawate et al. |
| 5,704,034 | A * | 12/1997 | Circello ................ G06F 11/364 714/34 |
| 5,724,291 | A | 3/1998 | Matano |
| 5,724,366 | A | 3/1998 | Furutani |
| 5,737,516 | A * | 4/1998 | Circello ................ G06F 11/364 714/35 |
| 5,751,987 | A | 5/1998 | Mahant-Shetti et al. |
| 5,787,458 | A | 7/1998 | Miwa |
| 5,854,636 | A | 12/1998 | Watanabe et al. |
| 5,867,429 | A | 2/1999 | Chen et al. |
| 5,870,504 | A | 2/1999 | Nemoto et al. |
| 5,915,084 | A | 6/1999 | Wendell |
| 5,935,263 | A | 8/1999 | Keeth et al. |
| 5,964,893 | A * | 10/1999 | Circello .............. G06F 11/3648 703/23 |
| 5,978,937 | A * | 11/1999 | Miyamori ........... G06F 11/3656 714/45 |
| 5,983,367 | A * | 11/1999 | Higuchi .............. G06F 11/2236 365/185.25 |
| 5,986,942 | A | 11/1999 | Sugibayashi |
| 5,991,209 | A | 11/1999 | Chow |
| 5,991,785 | A | 11/1999 | Alidina et al. |
| 6,005,799 | A | 12/1999 | Rao |
| 6,009,020 | A | 12/1999 | Nagata |
| 6,092,186 | A | 7/2000 | Betker et al. |
| 6,122,211 | A | 9/2000 | Morgan et al. |
| 6,125,071 | A | 9/2000 | Kohno et al. |
| 6,134,164 | A | 10/2000 | Lattimore et al. |
| 6,147,514 | A | 11/2000 | Shiratake |
| 6,151,244 | A | 11/2000 | Fujino et al. |
| 6,157,578 | A | 12/2000 | Brady |
| 6,163,862 | A | 12/2000 | Adams et al. |
| 6,166,942 | A | 12/2000 | Vo et al. |
| 6,172,918 | B1 | 1/2001 | Hidaka |
| 6,175,514 | B1 | 1/2001 | Henderson |
| 6,181,698 | B1 | 1/2001 | Hariguchi |
| 6,208,544 | B1 | 3/2001 | Beadle et al. |
| 6,226,215 | B1 | 5/2001 | Yoon |
| 6,301,153 | B1 | 10/2001 | Takeuchi et al. |
| 6,301,164 | B1 | 10/2001 | Manning et al. |
| 6,304,477 | B1 | 10/2001 | Naji |
| 6,389,507 | B1 | 5/2002 | Sherman |
| 6,418,498 | B1 | 7/2002 | Martwick |
| 6,466,499 | B1 | 10/2002 | Blodgett |
| 6,510,098 | B1 | 1/2003 | Taylor |
| 6,563,754 | B1 | 5/2003 | Lien et al. |
| 6,578,058 | B1 | 6/2003 | Nygaard |
| 6,731,542 | B1 | 5/2004 | Le et al. |
| 6,754,746 | B1 | 6/2004 | Leung et al. |
| 6,768,679 | B1 | 7/2004 | Le et al. |
| 6,807,614 | B2 | 10/2004 | Chung |
| 6,816,422 | B2 | 11/2004 | Hamade et al. |
| 6,819,612 | B1 | 11/2004 | Achter |
| 6,894,549 | B2 | 5/2005 | Eliason |
| 6,943,579 | B1 | 9/2005 | Hazanchuk et al. |
| 6,948,056 | B1 | 9/2005 | Roth |
| 6,950,771 | B1 | 9/2005 | Fan et al. |
| 6,950,898 | B2 | 9/2005 | Merritt et al. |
| 6,956,770 | B2 | 10/2005 | Khalid et al. |
| 6,961,272 | B2 | 11/2005 | Schreck |
| 6,965,648 | B1 | 11/2005 | Smith et al. |
| 6,985,394 | B2 | 1/2006 | Kim |
| 6,985,980 | B1 * | 1/2006 | Allegrucci .......... G06F 11/3632 710/107 |
| 6,987,693 | B2 | 1/2006 | Cernea et al. |
| 7,020,017 | B2 | 3/2006 | Chen et al. |
| 7,028,170 | B2 | 4/2006 | Saulsbury |
| 7,045,834 | B2 | 5/2006 | Tran et al. |
| 7,054,178 | B1 | 5/2006 | Shiah et al. |
| 7,061,817 | B2 | 6/2006 | Raad et al. |
| 7,079,407 | B1 | 7/2006 | Dimitrelis |
| 7,173,857 | B2 | 2/2007 | Kato et al. |
| 7,187,585 | B2 | 3/2007 | Li et al. |
| 7,196,928 | B2 | 3/2007 | Chen |
| 7,260,565 | B2 | 8/2007 | Lee et al. |
| 7,260,672 | B2 | 8/2007 | Garney |
| 7,266,728 | B1 * | 9/2007 | Edwards ............. G06F 11/3636 714/25 |
| 7,372,715 | B2 | 5/2008 | Han |
| 7,400,532 | B2 | 7/2008 | Aritome |
| 7,406,494 | B2 | 7/2008 | Magee |
| 7,447,720 | B2 | 11/2008 | Beaumont |
| 7,454,451 | B2 | 11/2008 | Beaumont |
| 7,457,181 | B2 | 11/2008 | Lee et al. |
| 7,535,769 | B2 | 5/2009 | Cernea |
| 7,546,438 | B2 | 6/2009 | Chung |
| 7,562,198 | B2 | 7/2009 | Noda et al. |
| 7,574,466 | B2 | 8/2009 | Beaumont |
| 7,602,647 | B2 | 10/2009 | Li et al. |
| 7,663,928 | B2 | 2/2010 | Tsai et al. |
| 7,685,365 | B2 | 3/2010 | Rajwar et al. |
| 7,692,466 | B2 | 4/2010 | Ahmadi |
| 7,752,417 | B2 | 7/2010 | Manczak et al. |
| 7,791,962 | B2 | 9/2010 | Noda et al. |
| 7,796,453 | B2 | 9/2010 | Riho et al. |
| 7,805,587 | B1 | 9/2010 | Van Dyke et al. |
| 7,808,854 | B2 | 10/2010 | Takase |
| 7,827,372 | B2 | 11/2010 | Bink et al. |
| 7,869,273 | B2 | 1/2011 | Lee et al. |
| 7,898,864 | B2 | 3/2011 | Dong |
| 7,924,628 | B2 | 4/2011 | Danon et al. |
| 7,937,535 | B2 | 5/2011 | Ozer et al. |
| 7,957,206 | B2 | 6/2011 | Bauser |
| 7,979,667 | B2 | 7/2011 | Allen et al. |
| 7,996,749 | B2 | 8/2011 | Ding et al. |
| 8,042,082 | B2 | 10/2011 | Solomon |
| 8,045,391 | B2 | 10/2011 | Mohklesi |
| 8,059,438 | B2 | 11/2011 | Chang et al. |
| 8,095,825 | B2 | 1/2012 | Hirotsu et al. |
| 8,117,462 | B2 | 2/2012 | Snapp et al. |
| 8,164,942 | B2 | 4/2012 | Gebara et al. |
| 8,208,328 | B2 | 6/2012 | Hong |
| 8,213,248 | B2 | 7/2012 | Moon et al. |
| 8,223,568 | B2 | 7/2012 | Seo |
| 8,238,173 | B2 | 8/2012 | Akerib et al. |
| 8,274,841 | B2 | 9/2012 | Shimano et al. |
| 8,279,683 | B2 | 10/2012 | Klein |
| 8,310,884 | B2 | 11/2012 | Iwai et al. |
| 8,332,367 | B2 | 12/2012 | Bhattacherjee et al. |
| 8,339,824 | B2 | 12/2012 | Cooke |
| 8,339,883 | B2 | 12/2012 | Yu et al. |
| 8,347,154 | B2 | 1/2013 | Bahali et al. |
| 8,351,292 | B2 | 1/2013 | Matano |
| 8,356,144 | B2 | 1/2013 | Hessel et al. |
| 8,417,921 | B2 | 4/2013 | Gonion et al. |
| 8,462,532 | B1 | 6/2013 | Argyres |
| 8,484,276 | B2 | 7/2013 | Carlson et al. |
| 8,495,438 | B2 | 7/2013 | Roine |

(56) References Cited

U.S. PATENT DOCUMENTS

| | | | |
|---|---|---|---|
| 8,503,250 B2 | 8/2013 | Demone | |
| 8,510,596 B1* | 8/2013 | Gupta | G06F 11/073 714/15 |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 9,250,299 B1* | 2/2016 | Yarlagadda | G01D 21/02 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0126349 A1* | 7/2003 | Nalawadi | G06F 9/4812 711/2 |
| 2003/0167426 A1 | 9/2003 | Slobodnik | |
| 2003/0191624 A1* | 10/2003 | Morigaki | G06F 11/364 703/28 |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0073891 A1* | 4/2005 | Usuki | G11C 29/02 365/201 |
| 2005/0078514 A1 | 4/2005 | Scheuerlein et al. | |
| 2005/0086454 A1* | 4/2005 | Morigaki | G06F 11/364 712/227 |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0155309 A1* | 6/2008 | Cheong | G06F 11/073 714/5.1 |
| 2008/0162757 A1* | 7/2008 | Tu | G06F 11/364 710/107 |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2008/0235547 A1* | 9/2008 | Chan | G11C 29/38 714/733 |
| 2008/0282121 A1* | 11/2008 | Rajeev | G11C 29/44 714/719 |
| 2009/0043993 A1* | 2/2009 | Ford | G06F 11/30 712/216 |
| 2009/0067218 A1 | 3/2009 | Graber | |
| 2009/0154238 A1 | 6/2009 | Lee | |
| 2009/0154273 A1 | 6/2009 | Borot et al. | |
| 2009/0158091 A1* | 6/2009 | Day | G06F 11/0715 714/25 |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0084552 A1* | 4/2012 | Sakthikumar | G06F 21/572 713/100 |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0163108 A1* | 6/2012 | Kazuno | G11C 29/026 365/201 |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0070212 A1* | 3/2014 | Fujiwara | G06K 19/0722 257/48 |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029798 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0279466 A1 | 3/2015 | Manning | |
| 2015/0120987 A1 | 4/2015 | Wheeler | |
| 2015/0134713 A1 | 5/2015 | Wheeler | |
| 2015/0186322 A1* | 7/2015 | Yao | G06F 21/00 714/42 |
| 2015/0270015 A1 | 9/2015 | Murphy et al. | |
| 2015/0324290 A1 | 11/2015 | Leidel | |

(56) References Cited

U.S. PATENT DOCUMENTS

| | | |
|---|---|---|
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2017/0083434 A1* | 3/2017 | Potash ............... G06F 9/00 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

* cited by examiner

APPARATUS AND METHODS FOR DEBUGGING ON A MEMORY DEVICE

TECHNICAL FIELD

The present disclosure relates generally to semiconductor memory and methods, and more particularly, to apparatus and methods for debugging on a memory device.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry may be external to the memory array, and data is accessed via a bus between the processing resources and the memory array to execute a set of instructions. Processing performance may be improved in a processing in memory (PIM) device, in which a processing resource may be implemented internal and/or near to a memory (e.g., directly on a same chip as the memory array). A processing in memory device may save time by reducing and/or eliminating external communications and may also conserve power.

DETAILED DESCRIPTION

Figure 1A:
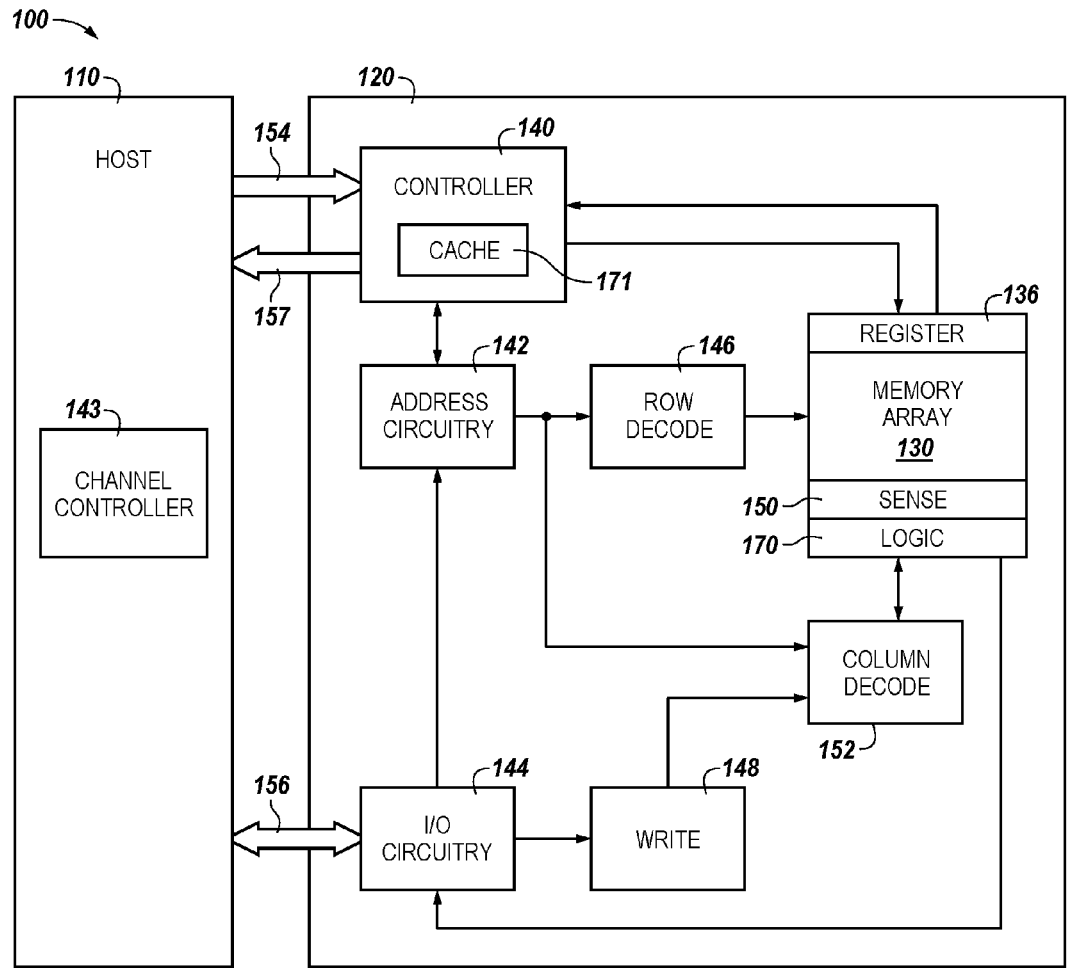
FIG. 1A is a block diagram of an apparatus in the form of an computing system including a memory device in accordance with a number of embodiments of the present disclosure.

The present disclosure includes apparatuses and methods for debugging on a memory device. In one embodiment, the apparatus comprises a memory device having an array of memory cells and sensing circuitry coupled to the array. The sensing circuitry comprises a sense amplifier and a compute component configured to perform logical operations. A controller is coupled to the array and sensing circuitry. The controller is configured to cause the memory device to store debugging code in the array of memory cells. The controller can cause the memory device to execute instructions to perform the logical operations using the sensing circuitry. The controller is further configured to receive an indication, in the executing instructions, to halt a logical operation and to execute the debugging code on the memory device.

Typically, debugging an executable program may be performed on a host using software and/or hardware. For example, a breakpoint to halt an executing program, and run a debugging routine thereon, may be embedded in the executable program itself and/or controlled by particular hardware. A debugging software routine may then step through to test the instructions of the executable program to verify the executable program's operation, expected function and results for accuracy. When an executable program is written by a programmer it is then compiled and afterwards a debugging routine may be run on the compiled executable program while it is run on a host. Hence a host may traditionally be used to debug a program in one of two ways: one, by setting a breakpoint in software to halt and start the debugging routine; and/or second, by using more complex hardware to provide a breakpoint to halt an executing program.

In a memory device, e.g., processing in memory (PIM) device, microcode may be used and executed thereon by a reduced instruction set computer (RISC) type processor. A RISC type processor is one of a family of processors which operates on a 32 or 64 bit instruction. Thus, as used herein, microcode on a PIM device is intended to include a 32 or 64 bit length instruction. Alternatively, microcode may include other bit length instructions executing on a PIM type device in which the instruction bit length is different than the instruction bit length being used with executable programs running on the host processor.

If a debugging routine is run on a host while RISC instructions are executing on a PIM device, the host processor may not be able to halt the executing RISC instructions on the PIM device. That is, the host processor has no way of providing a breakpoint to halt RISC instructions and signal to another device, e.g., a PIM device executing RISC instructions, that a debugging routine is to be run on the host. Typical debugging systems on modern computers are isolated to assembly language or higher level languages using on chip or off chip breakpoints. Such high level debugging concepts do not apply well to debugging microcode.

Embodiments of the present disclosure enable another device running microcode, such as a PIM device, to perform a debugging routine on the microcode directly on the device itself, separate from using a host processor to conduct and coordinate a debugging routine. To achieve this, a controller, e.g., memory controller (also referred to herein as a sequencer and/or PIM RAM controller), is configured to detect an indication within the microcode that an operation should be halted and a debugging routine executed. The description provided herein will follow an example embodiment of microcode on a PIM device, e.g., a PIM random access memory (RAM) device. One example of a RAM memory device, as discussed herein, is a dynamic random access memory (DRAM) device. Hence, examples herein may be discussed in relation to a PIM DRAM device. However, embodiments are not limited to the example use with a PIM device, PIM RAM, and/or PIM DRAM device.

In one example, microcode instructions for operation can be received to a memory device and stored in an array of memory cells on the memory device. In one example, a controller may receive the microcode instructions from a host and store the microcode for particular operations to a particular memory location on the memory device. The microcode instructions received to the memory device can include debugging instructions (also referred to as debugging code) for performing a debugging routine, e.g., operation, on other microcode instructions. The debugging instructions can similarly be stored to a particular memory location on the memory device with the other microcode instructions.

The controller can be configured to cause the memory device to execute instructions, e.g., execute microcode, to control the memory device operation. In some embodiments, a controller is provided that is configured to cause the memory device to perform a logical operation using sensing circuitry having a sense amplifier and a compute component. According to embodiments, an indication to signal to the controller to halt, e.g., stop, operations and to begin to execute debugging code on microcode instructions on the memory device is placed within the microcode instructions. For example, the indication may be in the form of one or more bits contained within the microcode instructions. In this example, the one or more bits may be set by a programmer and/or a host processor and received to and stored with the microcode instructions in a memory location on the memory device.

The one or more bits may be set to signal a breakpoint to the controller on a particular instruction. That is, the one or more bits may be set to signal to the controller to halt microcode instructions in connection with a particular operation. The controller can be configured to control the execution of the microcode instructions for operations on the memory device. In this manner, the controller can be configured to receive an indication in executing instructions to halt an operation associated with the microcode instructions when the controller detects the one or more bits set in a particular manner in the microcode instructions. In the one memory device example, the one or more bits may be set in association with a multiply operation, an add operation, or more specifically with an OR logical operation, etc., as defined by the microcode instructions to the memory device. In at least one example the memory device may be a processing in memory (PIM) device.

Hence, embodiments of the present disclosure provide apparatus and methods useful to enable debugging actual microcode operations within a memory device. Since microcode exists as a series of device instructions and since the microcode is updateable, apparatus and method embodiments can be provided to debug an instruction or multiple instructions.

In the example given above, one or more bits may be used, in the microcode itself, to designate if a certain operation will cause the controller, e.g., memory controller (sequencer), to halt, e.g., stop, pause, etc., a particular microcode operation and may cause a user, e.g., designer, developer, programmer, etc., to step over or continue the execution of the microcode operation. In one or more embodiments, one or more "debug" bits can be present on one or a multiple of microcode instructions. In normal microcode execution, no operation has a debug bit set. In a development environment, one or more debug bits can be set programmatically or received in a download of the microcode instructions to the memory device.

In some embodiments, the controller is configured to identify if a debug bit is set. If a debug bit is set in association with a particular operation, the controller may be configured to halt the microcode instruction operation. For example, a program counter associated with the controller may stop and new microcode instructions will not be allowed to execute. In some embodiments, a user, e.g., designer, developer, programmer, etc., may need to manually restart/resume the microcode instruction execution sequence. At this point the user may remove the one or more debug bits, e.g., breakout points, insert new debug bits, examine debug registers, or execute a single instruction at a time by enabling the a debug bit on all microcode instructions. In some embodiments, such actions may be contained in and/or performed by debugging code that is stored with the microcode instructions on the memory device.

In some example embodiments, the apparatus and methods include an efficient method of providing a large number of instructions, with arguments, to an array of memory cells, e.g., a dynamic random access memory (DRAM) array, on a memory device. The memory device may be configured to retrieve and to send, e.g., route, those instructions to an embedded processing engine, e.g., controller, of the memory device with low latency, while preserving the protocol, logical, and electrical interfaces for the array. Hence, embodiments described herein may facilitate keeping an address and/or control bus at a standard width and data rate, reducing any amount of "special" design for the memory device and also making the memory device more compatible with existing memory interfaces in a variety of computing devices.

Additionally, the embodiments described herein may allow the host system to provide a large block of instructions to an array of memory cells on a memory device at the beginning of an operation, significantly reducing, or completely eliminating, the interruptions in instruction execution to transfer more instructions to the memory device. Previous compromises in memory device design and control flow for an embedded processing engine, e.g., controller, with the memory device included significant increases in the I/O used for the memory device. This significant increase in the I/O used would increase the fraction of non-productive space on the memory device, increase the floor planning and noise containment complications, and increase the power dissipation on the memory device without adding additional computing performance. Also as noted above, other previous compromises included using relatively large, special purpose memory regions in a memory device to store instructions. Even so, such large, special purpose memory regions may not be large enough to hold the amount of microcode instructions used in a particular application. Thus, increased contention for the I/O resources on the overall chip may still occur and decrease the effective speed of a processing engine.

In order to appreciate the improved program instruction techniques an apparatus for implementing such techniques, a discussion of a memory device having processing in memory (PIM) capabilities, and interface of the memory device to an associated host, follows. According to various embodiments, microcode instructions, e.g., PIM commands, for a memory device can be received to the memory device from a host and stored to an array of memory cells on the memory device. The array may be associated with sensing circuitry that can perform logical operations by executing the microcode instructions. Thus, microcode instructions may be executed on the memory device in less time, and using less power, than would be required if executing the microcode instructions on a separate host.

Thus, improved parallelism and/or reduced power consumption in association with performing compute functions as compared to previous systems such as previous PIM systems and systems having an external processor (e.g., a processing resource located external from a memory array, such as on a separate integrated circuit chip) may be achieved. For instance, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus), for instance. Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

According to some embodiments a bit vector memory device, e.g., a PIM device capable of performing bit vector operations, may perform the logical operations. For example, PIM devices capable of bit vector operations operate on bit vectors. As used herein, the term "bit vector" is intended to mean a physically contiguous number of bits on a bit vector memory device, e.g., PIM device, whether physically contiguous in rows (e.g., horizontally oriented) or columns (e.g., vertically oriented) in an array of memory cells. Thus, as used herein a "bit vector operation" is intended to mean an operation that is performed on a bit-vector that is a contiguous portion (also referred to as "chunk") of virtual address space, e.g., used by a bit vector operation capable memory device. For example, a chunk of virtual address space may have a bit length of 256 bits. A chunk may or may not be contiguous physically to other chunks in the virtual address space.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with an array of memory cells and capable of performing compute functions such as gather and scatter operations local to the array of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system 100 including a memory device 120 in accordance with a number of embodiments of the present disclosure. As used herein, a memory device 120, memory controller 140, memory array 130, sensing circuitry 150, and/or logic circuitry 170 might also be separately considered an "apparatus."

Figure 1B:
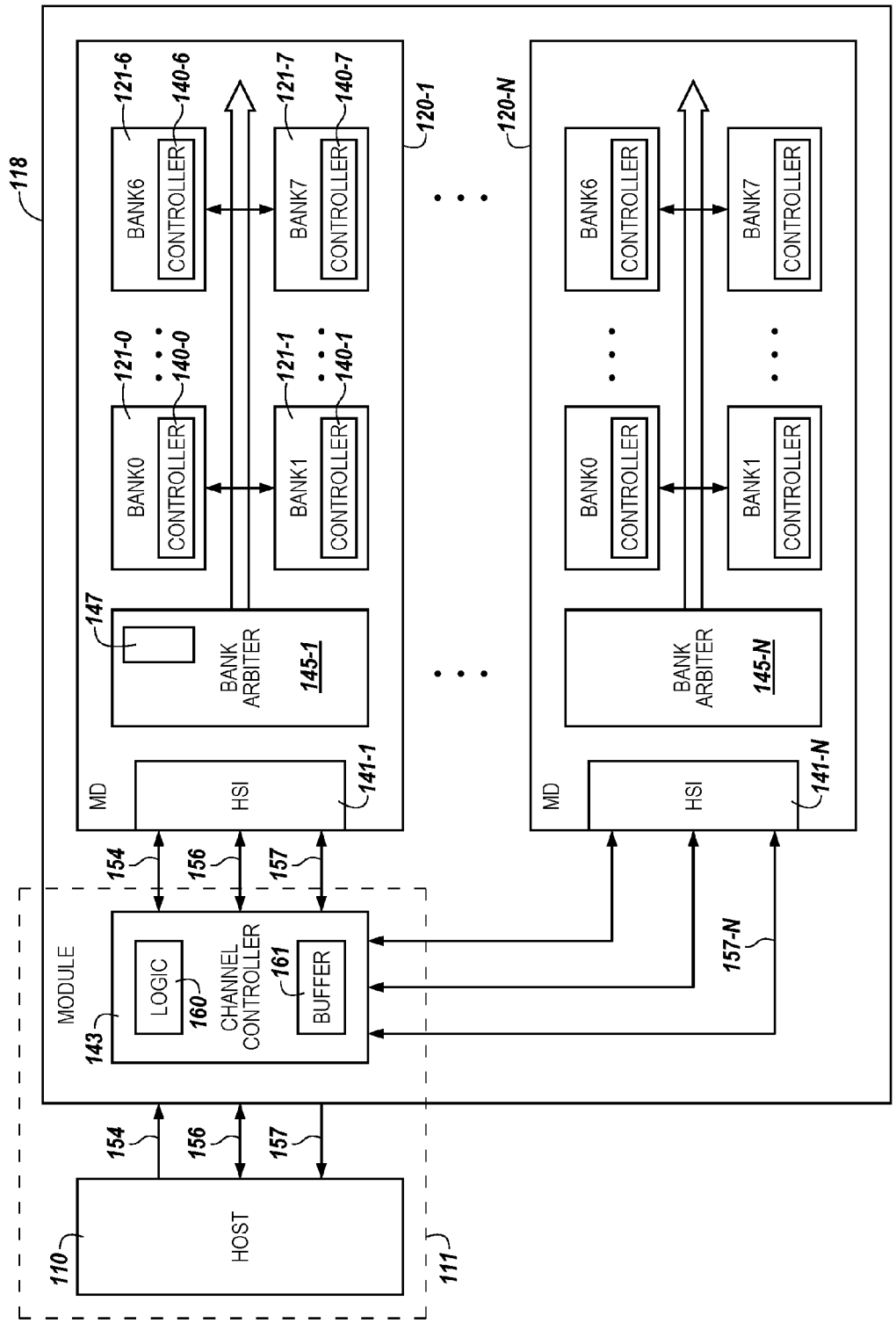
FIG. 1B is another block diagram of an apparatus in the form of an computing system including a memory device in accordance with a number of embodiments of the present disclosure.

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144. Status and/or exception information can be provided from the memory controller 140 on the memory device 120 to a channel controller 143, including an out-of-band bus 157 (shown in FIG. 1B), which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Memory controller 140 decodes signals provided by an address and control bus 154 from the host 110. According to various embodiments, the controller 140 can be a reduced instruction set computer (RISC) type controller operating on 32 and/or 64 bit length instructions. These signals can include chip enable signals, write enable signals, and address latch signals that are used to control operations performed on the memory array 130, including data read, data write, and data erase operations. In various embodiments, the memory controller 140 is responsible for executing instructions from the host 110. The memory controller 140 can be a state machine, a sequencer, or some other type of controller. The controller 140 can control shifting data (e.g., right or left) in an array, e.g., memory array 130.

Examples of the sensing circuitry 150 are described further below. For instance, in a number of embodiments, the sensing circuitry 150 can comprise a number of sense amplifiers and a number of compute components, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional peripheral sense amplifiers, registers, cache and/or data buffering, e.g., logic circuitry 170, can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1B is a block diagram of another apparatus architecture in the form of a computing system 100 including a plurality of memory devices 120-1, . . . , 120-N coupled to a host 110 via a channel controller 143 in accordance with a number of embodiments of the present disclosure. In at least one embodiment the channel controller 143 may be coupled to the plurality of memory devices 120-1, . . . , 120-N in an integrated manner in the form of a module 118, e.g., formed on same chip with the plurality of memory devices 120-1, . . . , 120-N. In an alternative embodiment, the channel controller 143 may be integrated with the host 110, as illustrated by dashed lines 111, e.g., formed on a separate chip from the plurality of memory devices 120-1, . . . , 120-N. The channel controller 143 can be coupled to each of the plurality of memory devices 120-1, . . . , 120-N via an address and control bus 154 as described in FIG. 1A which in turn can be coupled to the host 110. The channel controller 143 can also be coupled to each of the plurality of memory devices, 120-1, . . . , 120-N via a data bus 156 as described in FIG. 1A which in turn can be coupled to the host 110. In addition, the channel controller 143 can be coupled to each of the plurality of memory devices 120-1, . . . , 120-N via an out-of-bound (OOB) bus 157 associated with an interface, e.g., high speed interface (HSI), 141 that is configured to report status, exception and other data information to the channel controller 143 to exchange with the host 110.

As shown in FIG. 1B, the channel controller 143 can receive the status and exception information from the interface 141 (also referred to herein as a status channel interface) associated with a bank arbiter 145 in each of the plurality of memory devices 120-1, . . . , 120-N. In the example of FIG. 1B, each of the plurality of memory devices 120-1, . . . , 120-N can include a bank arbiter 145 to sequence control and data with a plurality of banks, e.g., Bank zero (0), Bank one (1), . . . , Bank six (6), Bank seven (7), etc. Each of the plurality of banks, Bank 0, . . . , Bank 7, can include a memory controller 140 and other components, including an array of memory cells 130 and sensing circuitry 150, logic circuitry 170, etc., as described in connection with FIG. 1A.

That is, each of the plurality of banks, e.g., Bank 0, . . . , Bank 7, in the plurality of memory devices 120-1, . . . , 120-N can include address circuitry 142 to latch address signals provided over a data bus 156 (e.g., an I/O bus) through I/O circuitry 144. Status and/or exception information can be provided from the memory controller 140 on the memory device 120 to the channel controller 143, using the OOB bus 157, which in turn can be provided from the plurality of memory devices 120-1, . . . , 120-N to the host 110. For each of the plurality of banks, e.g., Bank 0, . . . , Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers 161 to store an microcode instructions and can include logic 160 to allocate a plurality of locations, e.g., subarrays or portions of subarrays, in the arrays of each respective bank to store bank commands, and arguments, (PIM commands) for the various banks associated with to operation of each of the plurality of memory devices 120-1, . . . , 120-N. The channel controller 143 can dispatch commands, e.g., PIM commands, to the plurality of memory devices 120-1, . . . , 120-N to store those microcode instructions within a given bank of a memory device.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a memory controller 140, e.g., bank control logic and/or sequencer, associated with any particular bank, Bank 0, . . . , Bank 7, in a given memory device, 120-1, . . . , 120-N, can decode signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110. And, as above, the memory controller 140 can be a state machine, a sequencer, or some other type of controller. That is, the controller 140 can control shifting data (e.g., right or left) in an array, e.g., memory array 130.

Figure 1C:
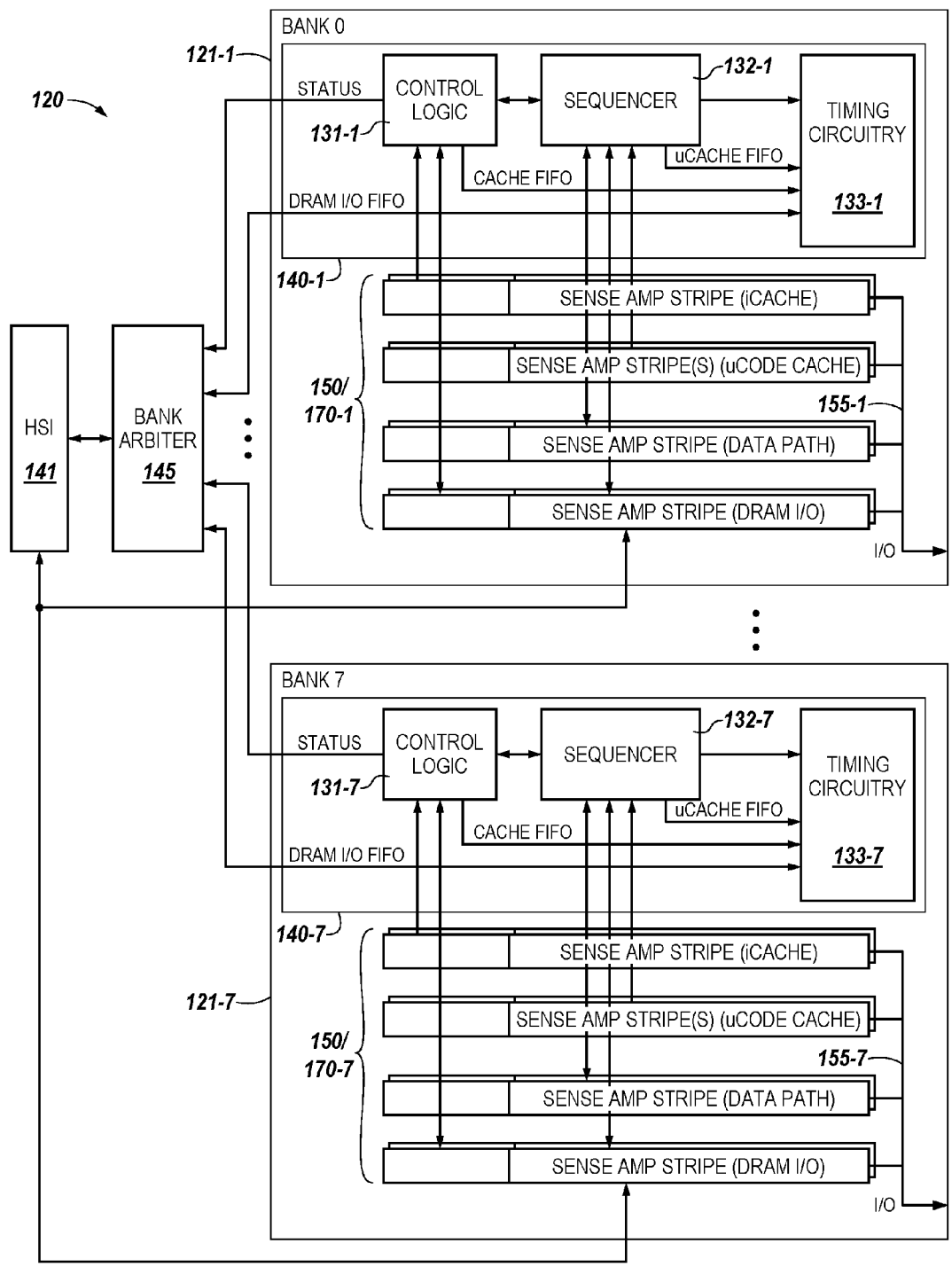
FIG. 1C is a block diagram of a memory device in accordance with a number of embodiments of the present disclosure.

FIG. 1C is a block diagram of a memory device in accordance with a number of embodiments of the present disclosure. The memory device may represent a memory device 120 shown in FIGS. 1A and 1B. As shown in FIG. 1C, an interface 141, e.g., high speed interface (HSI) and also referred to herein as a status channel interface, may be coupled to a bank arbiter 145 in the memory device 120. The HSI 141 may be coupled to a channel controller 143 via an address and control bus 154, data bus 156, and an out of band (OOB) bus 157 as described in FIGS. 1A and 1B. The bank arbiter 145 may be coupled to a plurality of banks 121-1, . . . , 121-7 (Bank 0-Bank 7).

In some embodiments, each bank 121-1, . . . , 121-7 (Bank 0-Bank 7) may be configured with a controller 140-1, . . . , 140-7. The controllers 140-1, . . . , 140-7 may represent the controllers shown in FIG. 1B. According to the example embodiment shown in FIG. 1C, each controller 140-1, . . . , 140-7 may comprise a control logic 131-1, . . . , 131-7, sequencer 132-1, . . . , 132-7, and timing circuitry 133-1, . . . , 133-7. In some embodiments the control logic 131-1, . . . , 131-7 may be responsible for fetching extended protocol instruction set architecture (EPISA) machine instructions, e.g., microcode instructions, from an array of memory cells, e.g., a DRAM array, in each bank 121-1, . . . , 121-7 (Bank 0-Bank 7). The control logic 131-1, . . . , 131-7 may decode the microcode instructions into calls, e.g., microcode functions (uCODE), implemented by the sequencers 132-1, . . . , 132-7. The microcode functions can be the operations that the sequencers 132-1, . . . , 132-7 receive and operate on to cause the memory device to perform particular logical operations. For example, the operations may be received and operated on by the sequencers 132-1, . . . , 132-7 to cause the sensing circuitry 150 shown in FIG. 1A to perform a logical operation, e.g., addition, multiplication, or, as a more specific example, a Boolean such as an OR operation, etc. The logical operation may additionally comprise DRAM operations such as a read, write, copy, and/or erase operation, etc. As shown, the controllers 140-1, . . . , 140-7 may be coupled to sensing circuitry 150 and/or logic 170, including cache, buffers, sense amplifiers and/or registers, associated with arrays of memory cells via control lines and data register 149/151, described more in connection with FIG. 1D. The sensing circuitry 150 and logic 170 can further be associated to the arrays of memory cells via data I/Os shown as 155-1, . . . , 155-7.

In some embodiments the sequencers 132-1, . . . , 132-7 may generate sequences of operation cycles for a DRAM array. For example, each sequence may be designed to perform a specific function, such as repetitively calculating the logic equations for a one (1) bit add in order to calculate a multiple bit sum. Each of these operations may be fed into a first in/first out (FIFO) buffer associated with timing circuitry 133-1, . . . , 133-7 for execution in the sensing circuitry 150 and logic 170 associated with the array of memory cells, e.g., DRAM arrays.

In the example embodiment shown in FIG. 1C the timing circuitry 133-1, . . . , 133-7, is responsible providing conflict free access to the arrays from four (4) FIFO queues. One FIFO queue may support array computation, one may be for Instruction fetch, one for microcode (e.g., Ucode) instruction fetch, and one for array, e.g., DRAM, I/O. In various embodiments both the control logic 131-1, . . . , 131-7 and the sequencers 132-1, . . . , 132-7 can generate status information, which is routed back to the bank arbiter 145 via a FIFO interface. The bank arbiter 145 may aggregate this status data and report it back to a channel controller, such as 143 shown in FIG. 1B, via the HSI 141.

Figure 1D:
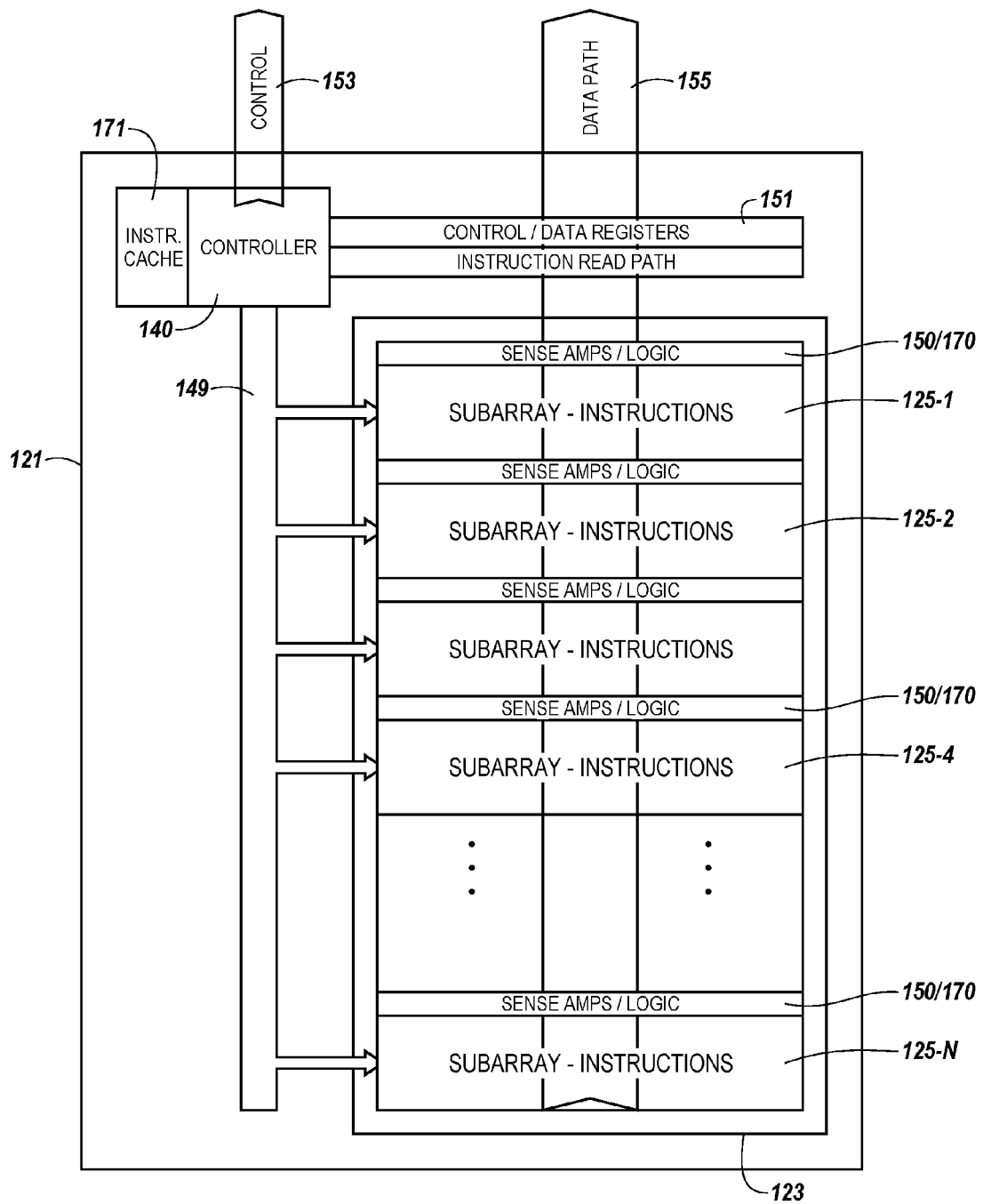
FIG. 1D is a block diagram of a bank to a memory device in accordance with a number of embodiments of the present disclosure.

FIG. 1D is a block diagram of a bank 121 to a memory device in accordance with a number of embodiments of the present disclosure. That is, bank 121 can represent an example bank to a memory device such as Bank 0, . . . , Bank 7 (121-0, . . . , 121-7) shown in FIG. 1B. As shown in FIG. 1D, a bank architecture can include an address and control bus, 154 coupled a controller 140. The controller 140 shown in FIG. 1D can, in example, represent at least a portion of the functionality embodied by and contained in the controller 140 shown in FIGS. 1A, 1B and 1C. Also, as shown in FIG. 1D, a bank architecture can include a data path, e.g., bus, 155, coupled to a plurality of control/data registers 151 in an instruction, e.g., microcode instructions (PIM commands), read path and coupled to a plurality of bank sections, e.g., bank section 123, in a particular bank 121.

Figure 2:
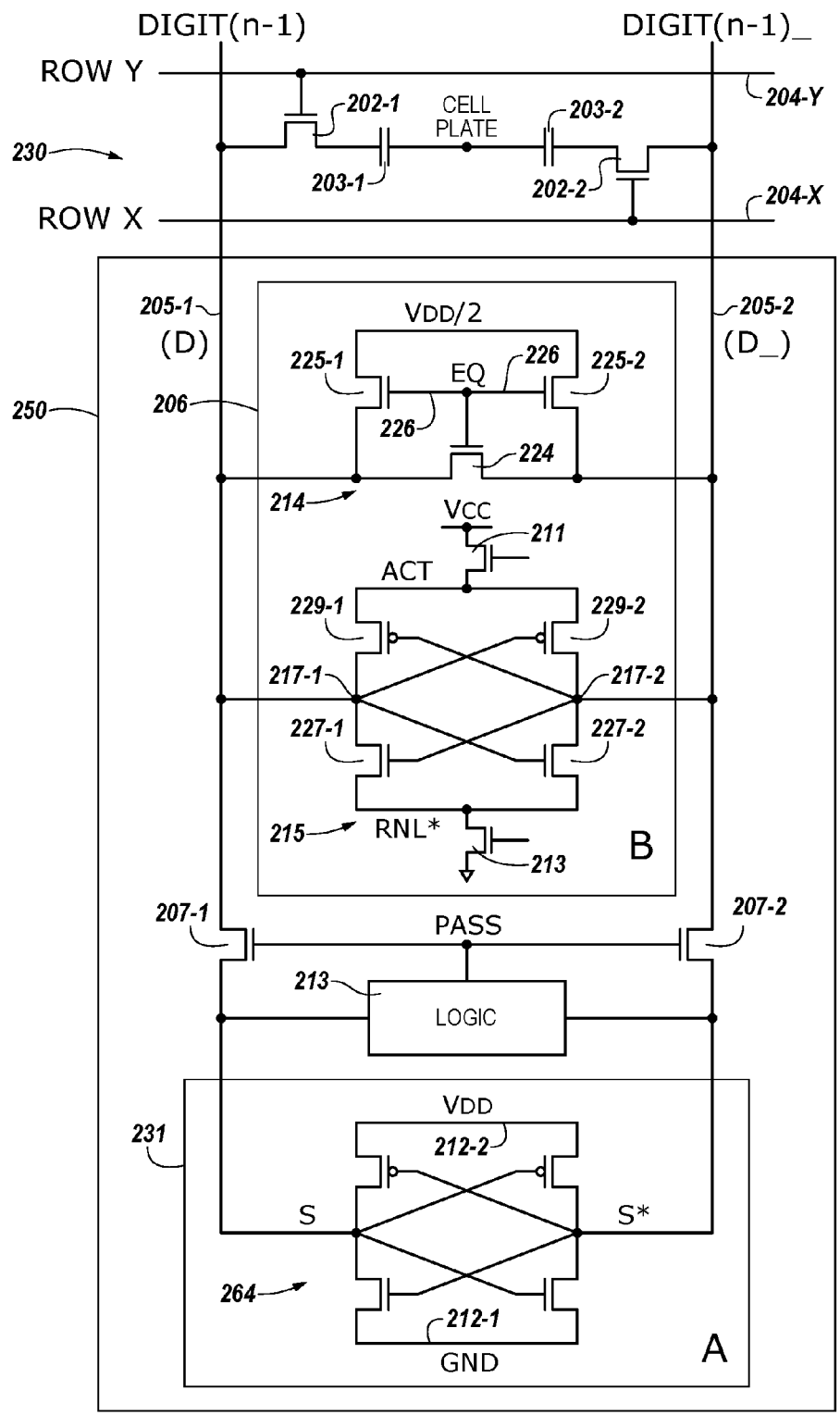
FIG. 2 is a schematic diagram illustrating sensing circuitry to a memory device in accordance with a number of embodiments of the present disclosure.
Figure 3:
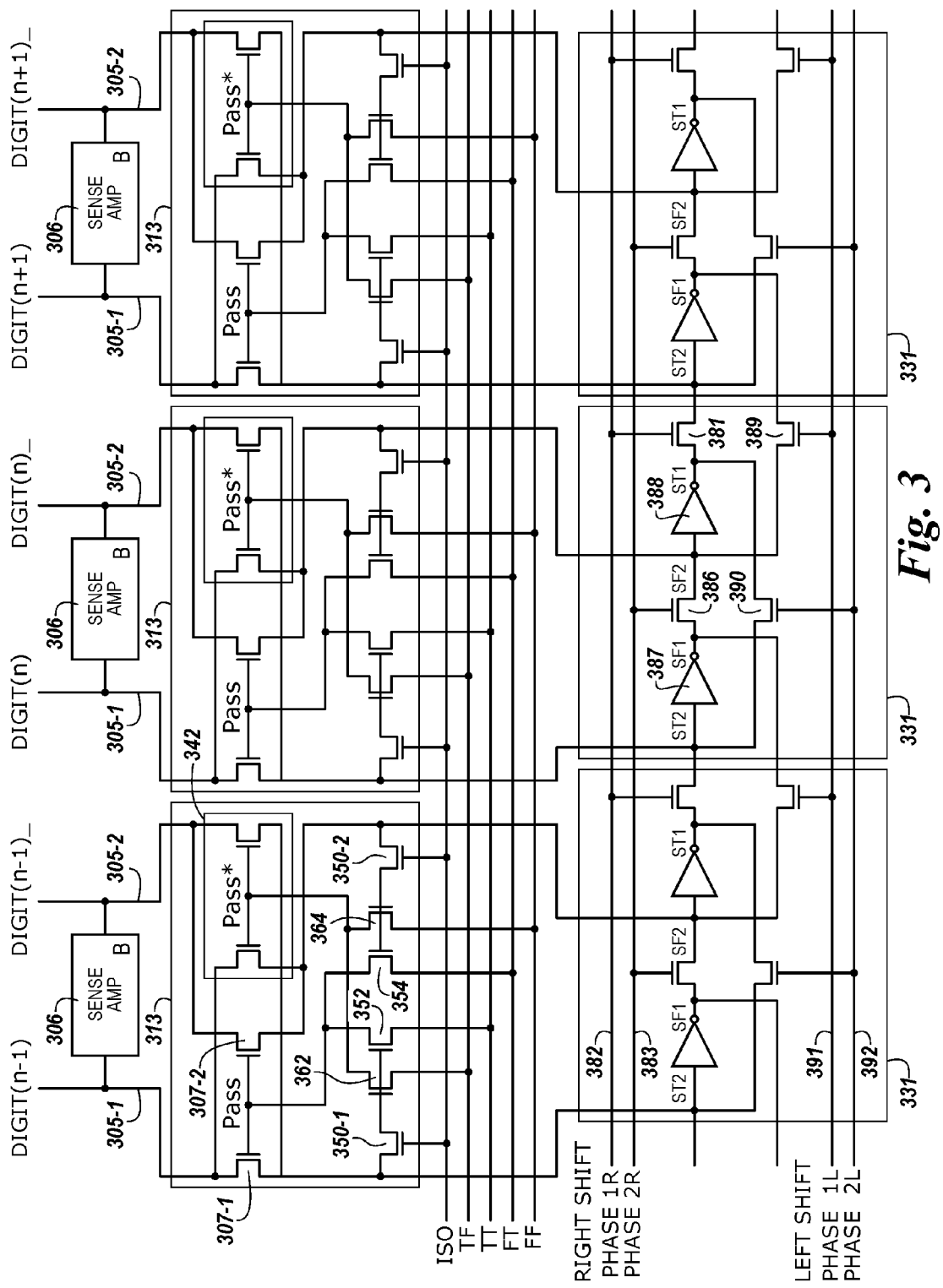
FIG. 3 is a schematic diagram illustrating sensing circuitry to a memory device in accordance with a number of embodiments of the present disclosure.
Figure 4:
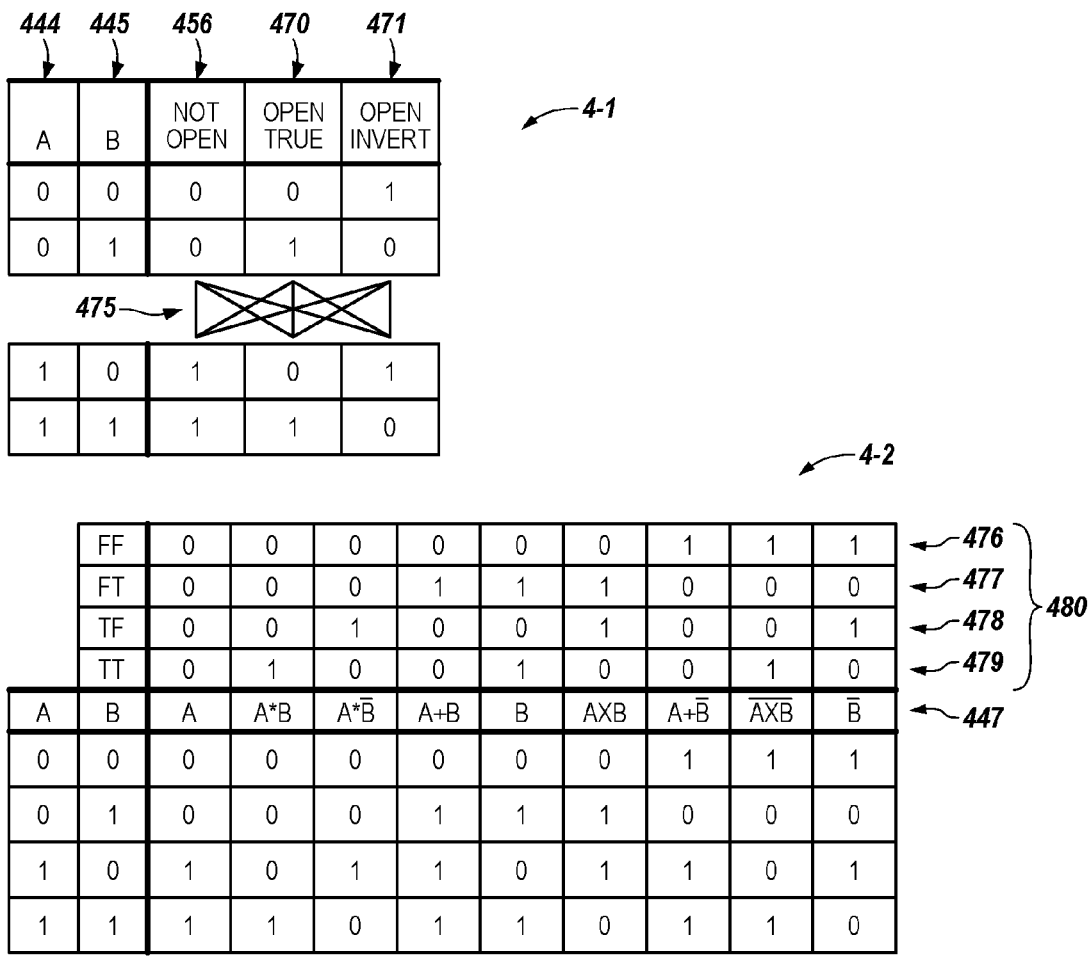
FIG. 4 is a logic table illustrating selectable logic operation results implemented by a sensing circuitry shown in FIG. 3 in accordance with a number of embodiments of the present disclosure.

As shown in FIG. 1D, a bank section 123 can be further subdivided into a plurality of sub-arrays (or subarrays) 125-1, 125-2, . . . , 125-N again separated by of plurality of sensing circuitry and logic 150/170 as shown in FIG. 1A and described further in connection with FIGS. 2-4. In one example, a bank section 121 may be divided into sixteen (16) subarrays. However, embodiments are not limited to this example number.

FIG. 1D, illustrates an instruction cache 171 associated with the controller 140 and coupled to a write path 149 and coupled to each of the subarrays 125-1, . . . , 125-N in the bank 123. Alternatively or additionally, logic circuitry 170 shown in FIG. 1A may be used as an instruction cache, e.g., used to cache and/or re-cache retrieved instructions local ("on-pitch") to a particular bank. In at least one embodiment, the plurality of subarrays 125-1, . . . , 125-N, and/or portions of the plurality of subarrays, may be referred to as a plurality of locations for storing microcode instructions, e.g., PIM commands, and/or constant data to a bank 123 in a memory device.

According to embodiments of the present disclosure, the controller 140 is configured to receive a block of instructions and/or constant data from a host, e.g., host 110 in FIG. 1A. Alternatively, the block of instructions and/or constant data may be received to the memory controller 140 from a channel controller 143 either integrated with the host 110 or separate from the host, e.g., integrated in the form of a module 118 with a plurality of memory devices, 120-1, . . . , 120-N, as shown in FIG. 1B.

The block of instructions and/or data can include a set of microcode instructions, e.g. PIM commands, and/or constant data, e.g., data to set up for PIM calculations. According to embodiments, the memory controller 140 is configured to store the block of instructions and/or constant data from the host 110 and/or channel controller 143 in an array, e.g., array 130 shown in FIG. 1A and/or bank section 123 and/or subarrays 125 shown in FIG. 1D, of a bank, e.g., banks 121-0, . . . , 121-7, shown in FIG. 1B. The controller 140 is further configured, e.g. includes logic in the form of firmware (e.g., microcode instructions) and/or hardware circuitry and/or application specific integrated circuitry (ASIC), to send, e.g., route, the instructions to the sensing circuitry, including a compute component. The sensing circuitry may include sensing circuitry shown as 150 in FIG. 1A and compute components 231 and 331 in FIGS. 2 and 3, to perform logical functions and/or operations, e.g., instruction execution, as described herein.

As shown in FIG. 1D, in at least one embodiment the controller 140 is configured to use DRAM protocol and DRAM logical and electrical interfaces to receive the microcode instructions and/or constant data from the host 110 and/or channel controller 143 and to route the microcode instructions and/or constant data to a compute component of sensing circuitry 150, 250 and/or 350. The microcode instructions and/or constant data received to the controller 140 can be pre-resolved, e.g., pre-defined, by a programmer and/or provided to the host 110 and/or channel controller 143.

In some embodiments, as seen in FIG. 1B, the array of memory cells (130 in FIG. 1A) includes a plurality of bank of memory cells 120-1, . . . , 120-N and the memory device 120 includes a bank arbiter 145 coupled to each of the plurality of banks 120-1, . . . , 120-N. In such embodiments, each bank arbiter is configured to receive an instruction block of microcode instructions and/or constant data relevant to a particular bank from the bank arbiter 145. The memory controller 140 can then store instructions in the received instruction block and/or constant data to a plurality of locations for the particular bank as allocated by the host 110 and/or channel controller 143. That is, the host 110 and/or channel controller 143 is configured to address translate the plurality of locations for the bank arbiter 145 to assign to banks of the memory device 120. In at least one embodiment, as shown in FIG. 1D, the plurality of locations includes a number of subarrays 125-1, . . . , 125-N in the DRAM banks 121-1, . . . , 121-7 and/or portions of the number of subarrays.

According to embodiments, each memory controller 140 can be configured to receive instructions from the host 110 and/or channel controller 143, e.g., on address and control bus 154, to start execution of the instruction block received to a given bank, 121-1, . . . , 121-7. The controller 140 is configured to then retrieve instructions, e.g., on read data path 155 with control and data registers 151, from the plurality of locations for the particular bank and execute using the compute component of the sensing circuitry 150. The memory controller 140 can cache retrieved instructions local to the particular bank, e.g. in instruction cache 171 and/or logic circuitry 170, to handle branches, loops, logical and data operations contained within the instructions block execution. And, the controller 140 can re-cache retrieved instructions as needed. Thus, the size of the dedicated instruction memory (cache) on the DRAM part does not have to be increased for a PIM system.

In some embodiments, a plurality of memory devices 120-1, . . . , 120-N are coupled to a host 110 and/or channel controller 143. Here, the host 110 and/or channel controller 143 can dispatch instruction blocks to an appropriate bank arbiter 145-1, . . . , 145-N for the plurality of memory devices, 120-1, . . . , 120-N, e.g., over a data bus 156.

Further, according to embodiments, the controller 140 is configured such that a bank 121 can receive a subsequent instruction block of microcode instructions relevant to the particular bank and store instructions in the received instruction block to a plurality of locations for the particular bank while, e.g., in parallel, the controller 140 is executing a previously received instruction block. Hence, the embodiments described herein avoid needing to wait for future, or a next set of instructions, e.g., PIM commands, to be received from a host 110 and/or channel controller 143. Instead, the apparatus and methods devices described herein facilitate a backing store in an array of memory cells on a memory device for microcode instructions. The embodiments may facilitate pre-writing a subsequent instruction block into allocated locations, while executing a previously received instruction block, in order to facilitate the start of future calculations in the memory device, e.g., bit vector operation capable device.

As the reader will appreciate, and as described in more detail in the examples of FIGS. 2-4, a controller, e.g., 140 in FIGS. 1A-1D, is configured to control the execution of microcode instructions, e.g., PIM commands, by controlling the sensing circuitry 150, including compute components 231 and/or 331 shown in FIGS. 2 and 3, to perform logical functions such as AND, OR, NOT, NAND, NOR, and XOR logical functions. The controller, e.g., 140, may be configured to control the sensing circuitry 150 to perform non-Boolean logic operations, including copy, compare and erase operations, as part of executing microcode instructions, e.g., PIM commands.

Figure 1E:
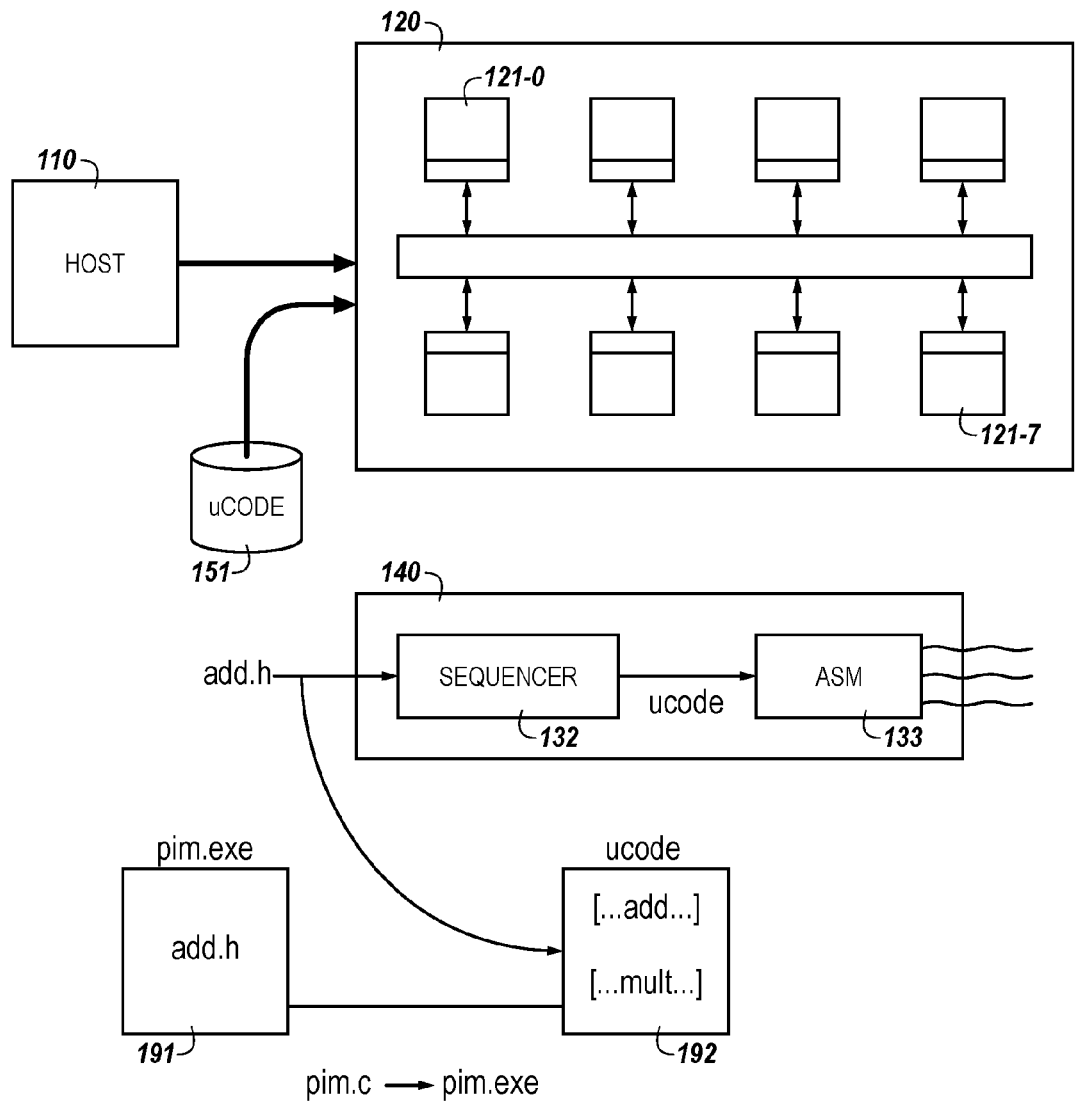
FIG. 1E illustrates microcode instructions may be compiled and retrieved to load to a plurality of locations in the memory device and may be operated upon by a controller to perform debugging on the memory device in accordance with a number of embodiments of the present disclosure.
Figure 1F:
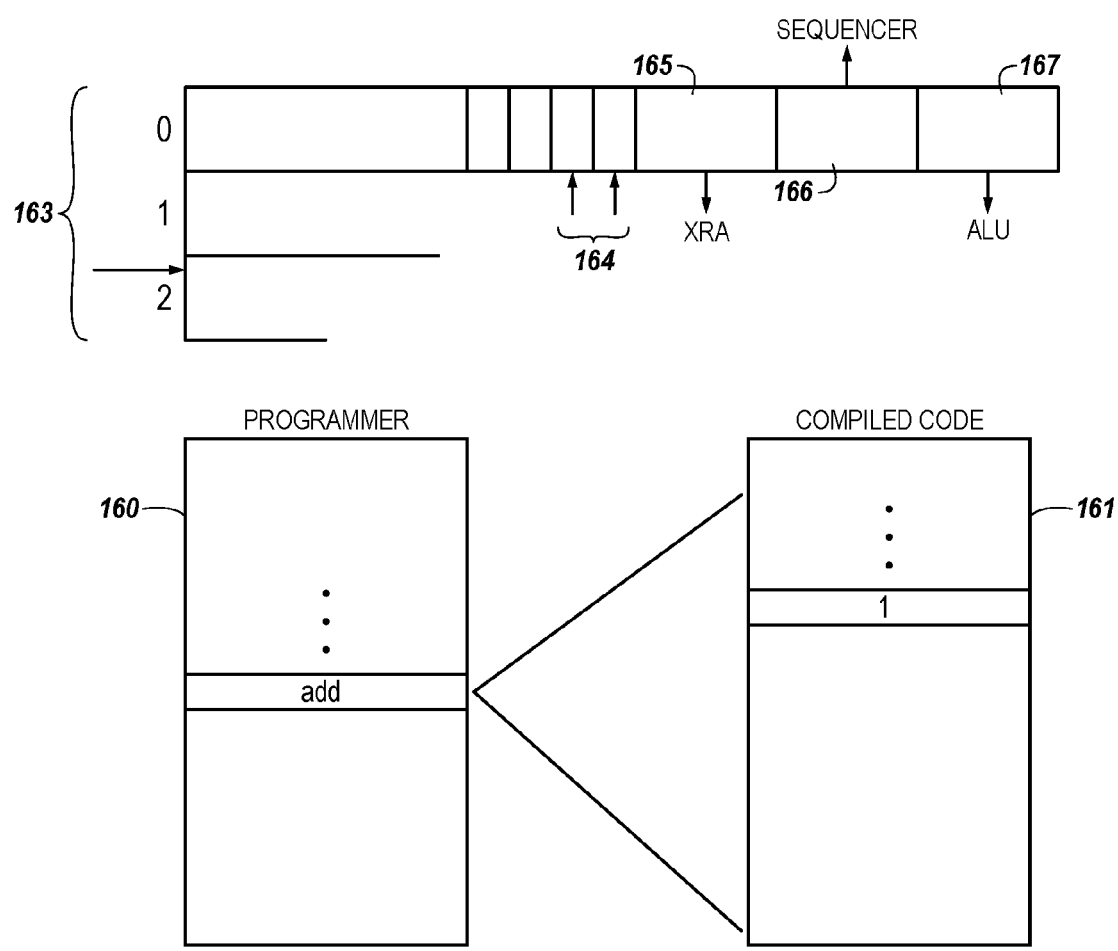
FIG. 1F illustrates one or more microcode instructions including an indication to a controller to halt an operation in association with a microcode instruction and conduct a debugging routine.

Additionally the controller 140 is configured to perform debugging operations directly on the memory device, e.g., 120 in FIGS. 1A-1D. For example, the controller may be configured to receive an indication in the executing microcode instructions and to execute debugging code and run a debugging operation on the microcode instructions on the memory device 120. FIGS. 1E and 1F are diagrams illustrating example embodiments of the manner in which instructions for a computing system may be compiled and stored to disk or database and retrieved to load to a plurality of locations, e.g., banks 121-1, . . . , 121-7 on a memory device 120 such as a bit vector operation capable device, e.g., processing in memory (PIM) device.

The example embodiment of FIG. 1E illustrates that microcode instructions 191, e.g., PIM program instructions, may be written in a programming language by a programmer and that PIM code (pim.c) may be compiled into a PIM executable file (pim.exe) by a compiler or other programming tool. The microcode instructions may be for execution on a memory device such as a bit vector operation capable memory device, e.g., PIM capable device. However, while PIM microcode instructions are used in the example described herein, embodiments are not limited to this example. Microcode instructions other than PIM microcode instructions for use with a device other than a PIM device are considered with the scope of the claims and embodiments of the present disclosure.

In the example embodiment of FIG. 1E, the PIM executable (pim.exe) may include instructions to perform a horizontal add operation (add.h), for example. The PIM executable (pim.exe) may be stored in a file or database 151 as microcode instructions. The microcode instructions may have microcode for many intended device operations such as PIM device operations including addition, multiplication, and/or more specific Boolean operations such as an OR logical operation, as reflected in the microcode 192.

According to various embodiments, a programmer may place an indication, e.g., breakpoint, in the microcode anywhere it is desired that an operation be halted and a debugging operation run on the microcode operation. For example, the programmer may set one or more particular bits in the microcode to signal to a controller to halt a particular operation on PIM device and to commence performing a debugging routine on the so indicated operation. According to embodiments, the one or more bits can be set to break on particular RISC type instructions, such as to break when a horizontal add instruction operation is received to the controller, or alternatively when a multiplication operation and/or OR operation is received, etc.

As shown in the example embodiment of FIG. 1E, the microcode instruction for an operation, such as a horizontal add operation (add.h), may be retrieved from a particular location where it has been stored, e.g., banks 121-1, . . . , 121-7, bank sections, subarrays, etc., in the PIM device 120 and provided to a controller 140 associated with the particular bank.

In at least one embodiment, a controller 140, and for example a sequencer 132 of the controller 140, may detect one or more bits set as an indication, e.g., as a breakpoint, received in microcode instructions to the controller 140 and may operate to cause the controller 140 to halt, e.g., stop or pause, execution of the operation and to commence a debugging routine on the operation with the PIM device 120. For example, the received microcode instructions to the controller 140 may include the indication and send the indication with microcode function calls to the sequencer 132. Hence, the sequencer is going to see a "debug" bit set in the microcode instructions and may cause circuitry 133 such as timing circuitry, e.g., an atomic state machine (ASM), associated with the controller 140 to begin a debugging routine on the microcode instructions.

It is noted that according to embodiments, the PIM device 120 may allow for normal operations, read, write, etc., to continue to function with the PIM device, e.g., continue to read and/or write to an array of memory cells, e.g., DRAM array, on the PIM device. For example, the read and/or write operations can be used with the debugging routine being conducted on the microcode instructions on the PIM device. In this example, the ASM circuitry 133 can be responsible for providing conflict free access to the arrays of memory cells in the PIM device 120 in association with conducting a debugging routine.

FIG. 1F illustrates that one or more microcode instructions 163 may be composed of a plurality of bit fields 164, 165, 166 and 167. For example, a microcode instruction may be 64 bit word with several spare or unused bit fields available to be used as debug bits, according to embodiments described herein. In the example of FIG. 1F, the unused bit fields 164 can then be used by a programmer to set an indication directly within the a particular microcode instruction that an operation should break upon receipt of the instruction by a controller and that a debugging routine is to be commenced. As shown, other bit fields in the microcode instructions will serve other microcode instructions purposes such logic bit fields 165, e.g., extended row address (XRA) bit fields, sequencer instruction bit fields 166, arithmetic logic unit (ALU) bit fields 167, etc. Embodiments are not limited to the example shown in FIG. 1F.

Hence, as a programmer writes program instructions 160 for a device, e.g., PIM device, the programmer will code particular operations, e.g., an addition (add) operation, and may insert an indication, e.g., breakpoint indication, directly into the program instructions 160. As those program instructions are compiled 161 the indication may be converted to one or more set bits, e.g., "debug" bits, in the microcode instructions which will then be present in the microcode instructions 163 themselves.

According to embodiments, one or more of the debug bit fields 164 in the microcode instructions 163 may contain additional information on the debug routine itself. For example, a first debug bit may be set to signal to a controller 140 to halt execution of the operation associated with that microcode instruction. In one or more embodiments, a sequencer 132 associated with the controller 140 is halted by spinning, e.g., by entering a loop until the detected bit is reset. Other bits to the one or more debug bit fields 164 may be set to signal a debug action and/or routine to execute.

As the reader will appreciate, one or more other debug bits may be set to signal a debug routine to execute a step, single step, or step over debugging action. For example, a single step debugging action may include executing a debugging routine until the sequencer 132 reaches a next microcode instruction. Alternatively, a step over debugging action may be signaled in which the debugging routine runs on one microcode instruction, steps over a next microcode instruction, and continues on a subsequent microcode instruction. In the example of FIG. 1F, three (3) microcode instruction lines are illustrated, e.g., 0, 1, and 2. Hence in the step over debugging action, a debugging routine would be conducted for the operation associated with microcode instruction 0, microcode instruction 1 would be stepped over and the debugging routine would continue to be conducted for the operation associated with microcode instruction 2 (as shown by the "arrow").

As noted above, such debug bits can be present on one or a multiple of microcode instructions. In normal execution it is possible that no operation may have an indication contained in the microcode instructions, e.g. may not have one or more debug bits set. In the development environment, the debug bit fields 164 can be set programmatically or in the download of the microcode sequence. Embodiments are not limited to the examples given herein.

In various embodiments, the sequencer 132 of a controller 140 is configured to identify whether a debug bit has been set. If the sequencer 132 detects that a given debug bit is set, a program counter associated with the sequencer 132 can be stopped and new instructions prevented from executing. In some embodiments, a user may have to manually restart/resume the executing sequence once the debugging routine is complete. Accordingly, a programmer may add and/or remove indications, e.g., breakpoint indications, from the microcode instructions together with examining debug register results.

FIGS. 2-4 illustrate additional functionality of a PIM RAM device, e.g., PIM DRAM device, according to one or more embodiments of the present disclosure. FIG. 2 is a schematic diagram illustrating sensing circuitry 250 in accordance with a number of embodiments of the present disclosure. The sensing circuitry 250 can correspond to sensing circuitry 150 shown in FIG. 1A. A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage Vcc through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., VDD/2), where VDD is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., Vcc/2).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., VDD), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry, including compute component, 150 shown in FIG. 1A, for example. The logical operation selection logic 313 shown in FIG. 3 can correspond to logical operation selection logic 413 shown in FIG. 4, for example.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

According to the embodiment illustrated in FIG. 3, the compute components 331 can comprise respective stages (e.g., shift cells) of a loadable shift register configured to shift data values left and right. For example, as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary sense lines 305-1 and 305-2 when the isolation transistors 350-1 and 350-2 are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. That is, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) and data value on the true sense line is "1" or the FT control signal is activated (e.g., high) and the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal Pass* can be activated (e.g., high) to OPEN the swap transistors 342 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values (e.g., inverse operands and/or inverse result), among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry, e.g., 150 in FIG. 1A, are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device, comprising:
     an array of memory cells;
     sensing circuitry coupled to the array, the sensing circuitry including a sense amplifier and a compute component configured to perform logical operations on the memory device; and
     a controller coupled to the array and sensing circuitry, the controller configured to cause the memory device to:
       store debugging code in the array of memory cells;
       execute instructions to perform logical operations using the sensing circuitry, wherein the instructions to perform the logical operations are stored in the array of memory cells; and
       receive an indication in the executing instructions to halt a logical operation and to execute the debugging code on the memory device, wherein the indication is stored within the instructions to perform the logical operations.

2. The apparatus of claim 1, wherein the array of memory cells are dynamic random access memory (DRAM) cells.

3. The apparatus of claim 2, wherein the controller is configured to use a DRAM protocol and DRAM logical and electrical interfaces to execute the debugging code in the memory device.

4. The apparatus of claim 1, wherein the controller is configured to receive the instructions pre-resolved by the host.

5. An apparatus, comprising:
a memory device, comprising:
an array of memory cells;
sensing circuitry coupled to the array, the sensing circuitry including a sense amplifier and a compute component configured to perform logical operations on the memory device; and
a controller coupled to the array and sensing circuitry, the controller configured to cause the memory device to:
store microcode instructions containing debugging code in the array of memory cells;
execute microcode instructions to perform logical operations using the sensing circuitry; and
detect one or more bits in the executing microcode instructions to halt a logical operation and perform a debugging routine according to the debugging code on the memory device.

6. The apparatus of claim 5, wherein:
a bank arbiter is coupled to a plurality of banks in the memory device; and each bank of the plurality of banks includes a memory controller configured to:
receive an instruction block of microcode instructions relevant to a particular bank from the bank arbiter; and
store instructions in the received instruction block to a plurality of locations for the particular bank as allocated by the host.

7. The apparatus of claim 6, wherein each memory controller is configured to:
receive instructions to start execution of the instruction block;
retrieve instructions from a plurality of locations for a bank of the memory die as needed to handle branches, loops, logical and data operations contained within the instruction block;
cache retrieved instructions local to the bank; and
re-cache retrieved instructions as needed.

8. The apparatus of claim 5, wherein:
the apparatus further includes logic circuitry coupled to the sensing circuitry, the logic circuitry including latches in the form of sense amplifiers; and
wherein the memory controller is configured to cache and re-cache retrieved instructions to the logic circuitry.

9. The apparatus of claim 5, wherein:
the apparatus comprises a plurality of memory device, each memory device of the plurality of memory device having a bank arbiter configured to couple to a channel controller via an interface; and
wherein the channel controller is configured to dispatch instruction blocks to each bank arbiter for each of the plurality of memory device.

10. The apparatus of claim 9, wherein the apparatus is configured to:
receive a subsequent instruction block of microcode instructions to a bank of a respective memory device via a respective bank arbiter;
store instructions in the subsequent received instruction block to a plurality of locations for the bank while the memory controller is executing a previously received instruction block; and
start of future calculations by the compute component.

11. An apparatus, comprising:
a memory device having a bank arbiter coupled to a plurality of memory banks, the bank arbiter to dispatch microcode instructions to the plurality of banks, wherein each bank of the plurality of banks comprises:
an array of memory cells;
sensing circuitry coupled to the array, the sensing circuitry including a sense amplifier and a compute component configured to perform logical operations; and
a controller coupled to the array and the sensing circuitry, wherein the controller is configured to:
store debugging code in the array of memory cells;
execute instructions to perform logical operations using the sensing circuitry; and
receive an indication in the executing instructions to halt a logical operation and to execute the debugging code on the memory device.

12. The apparatus of claim 11, wherein the apparatus is configured to:
receive an instruction block of microcode instructions relevant to the bank arbiter from a channel controller; and
store instructions in the received instruction block to a plurality of locations in the array as allocated by the channel controller.

13. The apparatus of claim 12, wherein:
the array of memory cells is a dynamic random access memory (DRAM) array of memory cells; and
the controller is configured to use a DRAM protocol and DRAM logical and electrical interfaces to:
receive the microcode instructions from the channel controller via the bank arbiter; and
route the microcode instructions to the compute component.

14. The apparatus of claim 11, wherein the controller comprises:
control logic;
a sequencer; and
timing circuitry.

15. The apparatus of claim 11, wherein the control state machine is configured to:
retrieve the instructions from a dynamic random access memory (DRAM) array on the memory device; and
decode the instructions into microcode operations to be implemented by the sequencer.

16. The apparatus of claim 15, wherein the sequencer is configured to:
generate sequences of operations for the DRAM array on the memory device, the sequences of operations comprising logical operations using the sensing circuitry; and
wherein the sequences of operations include halting the logical operation and executing the debugging code on the memory device upon receipt of the indication by the sequencer.

17. The apparatus of claim 16, wherein timing circuitry is configured to provide conflict free access to the DRAM array from a plurality of first in first out (FIFO) queues.

18. The apparatus of claim 17, wherein the plurality of FIFO queues comprises:

an array computation FIFO;
an instruction fetch FIFO;
a microcode fetch FIFO; and
an array input/output (I/O) FIFO.

19. The apparatus of claim 16, wherein the control state machine and the sequencer are configured to:
generate status information;
route the status information to the bank arbiter via a status interface; and
wherein the bank arbiter is configured to:
aggregate the status information; and
report the status information to a channel controller via an out of bound bus.

20. A method for debugging on a memory device, comprising:
storing microcode instructions containing debugging code in an array of memory cells;
receiving microcode instructions to a controller on the memory device to perform logical operation;
detecting an indication in the received microcode instructions to halt a logical operation and to perform a debugging routine according to the debugging; and
executing microcode instructions on the memory device using sensing circuitry having a sense amplifier and a compute component to perform the logical operations.

21. The method of claim 20, wherein the method comprises:
storing the microcode instructions in a dynamic random access memory (DRAM) array of a processing in memory (PIM) device using the controller on the memory device.

22. The method of claim 20, wherein the method comprises performing a single step debugging operation according to the debug code to step to a next microcode instruction.

23. The method of claim 20, wherein the method comprises performing a step over debugging operation according to the debug code to step over a next microcode instruction and to continue a perform a debugging routine on a subsequent microcode instruction.

24. An apparatus, comprising:
a memory device, comprising:
an array of memory cells;
sensing circuitry coupled to the array, the sensing circuitry including a sense amplifier and a compute component configured to perform logical operations on the memory device; and
a controller coupled to the array and sensing circuitry, the controller configured to cause the memory device to:
store debugging code in the array of memory cells;
execute instructions to perform logical operations using the sensing circuitry, wherein the instructions to perform the logical operations are stored in the array of memory cells; and
receive an indication in the executing instructions to halt a logical operation and to execute the debugging code on the memory device, wherein the indication is a bit stored within the instructions to cause the controller to halt the logical operation.

25. An apparatus, comprising:
a memory device, comprising:
an array of memory cells;
sensing circuitry coupled to the array, the sensing circuitry including a sense amplifier and a compute component configured to perform logical operations on the memory device; and
a controller coupled to the array and sensing circuitry, the controller configured to cause the memory device to:
store debugging code in the array of memory cells;
execute instructions to perform logical operations using the sensing circuitry, wherein the instructions to perform the logical operations are stored in the array of memory cells; and
receive an indication in the executing instructions to halt a logical operation and to execute the debugging code on the memory device, wherein the indication is stored within the instructions to perform the logical operations; and
the indication is configured to cause the controller to;
pause execution of a logical operation; and
continue the logical operation according to the debugging code.

26. The apparatus of claim 25, wherein the debugging code comprises instructions to cause the memory device to continue the logical operation while executing a debugging step operation.

27. The apparatus of claim 25, wherein the debugging code comprises instructions to cause the memory device to continue the logical operation while executing a single step debugging operation.

28. The apparatus of claim 25, wherein the debugging code comprises instructions to cause the memory device to continue the logical operation while executing a step over debugging operation.

29. An apparatus, comprising:
a memory device, comprising:
an array of memory cells;
sensing circuitry coupled to the array, the sensing circuitry including a sense amplifier and a compute component configured to perform logical operations on the memory device; and
a controller coupled to the array and sensing circuitry, the controller configured to cause the memory device to:
store debugging code in the array of memory cells;
execute instructions to perform logical operations using the sensing circuitry; and
receive an indication in the executing instructions to halt a logical operation and to execute the debugging code on the memory device, wherein the instructions are microcode instructions, and wherein the debugging code and the indication are contained in the microcode instructions.

30. A method for debugging on a memory device, comprising:
storing microcode instructions containing debugging code in an array of memory cells;
receiving microcode instructions to a controller on the memory device to perform logical operations,
detecting an indication in the received microcode instructions to halt a logical operation and to perform a debugging routine according to the debugging, wherein detecting the indication in the microcode instructions comprises detecting one or more set bits in the received microcode instructions to halt the logical operation and perform the debugging routine.

31. The method of claim 30, wherein detecting the one or more set bits comprises:
using a sequencer in the controller to identify a set debug bit in the microcode instructions; and
stopping a program counter and not allowing new instructions to execute.

32. A method for debugging on a memory device, comprising:
- storing microcode instructions containing debugging code in an array of memory cells;
- receiving microcode instructions to a controller on the memory device to perform logical operations;
- detecting an indication in the received microcode instructions to halt a logical operation and to perform a debugging routine according to the debugging; and
- setting a debug bit in the microcode instructions programmatically after the microcode instructions are stored on the memory device.

33. A method for debugging on a memory device, comprising:
- storing microcode instructions containing debugging code in an array of memory cells;
- receiving microcode instructions to a controller on the memory device to perform logical operations,
- detecting an indication in the received microcode instructions to halt a logical operation and to perform a debugging routine according to the debugging,
- executing microcode instructions on the memory device using sensing circuitry having a sense amplifier and a compute component to perform the logical operations, wherein the executing microcode instructions on the memory device includes executing the microcode instructions on a processing in memory (PIM) device; and
- using sensing circuitry on the PIM device to:
  - perform logical functions including AND, OR, NOT, XOR, NAND, and NOR logical functions; and
  - non-Boolean logic operations including copy, compare and erase.

34. The method of claim 33, wherein the method comprises storing the microcode instructions to a plurality of subarrays in a dynamic random access memory (DRAM) on the PIM.

* * * * *